(12) United States Patent
Ye et al.

(10) Patent No.: US 6,486,706 B2
(45) Date of Patent: Nov. 26, 2002

(54) DOMINO LOGIC WITH LOW-THRESHOLD NMOS PULL-UP

(75) Inventors: Yibin Ye, Hillsboro, OR (US); Siva G. Narendra, Beaverton, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/731,515

(22) Filed: Dec. 6, 2000

(65) Prior Publication Data

US 2002/0067189 A1 Jun. 6, 2002

(51) Int. Cl.[7] .................... H03K 19/096; H03K 19/20
(52) U.S. Cl. .................................. 326/98; 326/112
(58) Field of Search .......................... 326/98, 95, 93, 326/112, 113, 119, 121

(56) References Cited

U.S. PATENT DOCUMENTS

| | | | |
|---|---|---|---|
| 4,571,510 A | 2/1986 | Seki et al. | |
| 4,697,109 A | 9/1987 | Honma et al. | 307/475 |
| 4,899,066 A | 2/1990 | Aikawa et al. | |
| 5,115,150 A | 5/1992 | Ludwig | |
| 5,258,666 A | 11/1993 | Furuki | |
| 5,453,708 A | 9/1995 | Gupta et al. | 326/98 |
| 5,543,735 A | 8/1996 | Lo | 326/93 |
| 5,568,062 A | 10/1996 | Kaplinsky | 326/27 |
| 5,657,256 A | 8/1997 | Swanson et al. | 364/580 |
| 5,661,675 A | 8/1997 | Chin et al. | 364/768 |
| 5,671,151 A | 9/1997 | Williams | 364/489 |
| 5,731,983 A | 3/1998 | Balakrishnan et al. | 364/489 |
| 5,748,012 A | 5/1998 | Beakes et al. | 326/93 |
| 5,796,282 A | 8/1998 | Sprague et al. | 327/210 |
| 5,815,005 A | 9/1998 | Bosshart | 326/95 |
| 5,825,208 A | 10/1998 | Levy et al. | 326/98 |
| 5,831,990 A | 11/1998 | Queen et al. | 371/22.1 |
| 5,852,373 A | 12/1998 | Chu et al. | 326/98 |
| 5,886,540 A | 3/1999 | Perez | 326/93 |

(List continued on next page.)

FOREIGN PATENT DOCUMENTS

| | | | |
|---|---|---|---|
| EP | 0954101 | 3/1999 | H03K/19/096 |
| JP | 359039124 A | * 3/1984 | 326/98 |
| JP | 04-239221 | 8/1992 | H03K/19/096 |

OTHER PUBLICATIONS

Xun, L., et al., "Minimizing Sensitivity to Delay Variation in High–Performance Synchronous Circuits", *Proceedings of the Design, Automation and Test in Europe Conference*, Munich, Germany, (Mar. 9–12, 1999), 643–649.

(List continued on next page.)

*Primary Examiner*—Michael Tokar
*Assistant Examiner*—James H Cho
(74) *Attorney, Agent, or Firm*—Schwegman, Lundberg, Woessner & Kluth, P.A.

(57) ABSTRACT

A domino logic circuit includes an n-channel clock transistor coupled between a dynamic output node and a high voltage connection, the gate of the clock transistor further coupled to receive an inverse clock signal. A first inverter has an input connected to the dynamic output node. A second inverter with an input connected to the dynamic output node comprises a static CMOS circuit stage, the output of which is the output of the domino logic circuit. A p-channel level keeper transistor is connected between the dynamic output node and the high voltage connection, and the gate of the level keeper transistor is connected to the output of the first inverter. A pull-down circuit is connected between the dynamic output node and a low-voltage connection. A pull-up circuit is connected between the static CMOS circuit output and the high voltage connection. An output precharge transistor is connected between the output of the static CMOS circuit and the low voltage connection, and is coupled to and controlled by a clock signal at its gate.

20 Claims, 1 Drawing Sheet

U.S. PATENT DOCUMENTS

| | | | | |
|---|---|---|---|---|
| 5,889,417 | A | 3/1999 | Klass et al. | 326/98 |
| 5,892,372 | A | 4/1999 | Ciraula et al. | 326/96 |
| 5,896,046 | A | 4/1999 | Bjorksten et al. | 326/98 |
| 5,896,399 | A | 4/1999 | Lattimore et al. | 371/21.1 |
| 5,898,330 | A | 4/1999 | Klass | 327/210 |
| 5,917,355 | A | 6/1999 | Klass | 327/208 |
| 5,942,917 | A | 8/1999 | Chappell et al. | 326/121 |
| 6,002,272 | A | 12/1999 | Somasekhar et al. | 326/98 |
| 6,002,292 | A | 12/1999 | Allen et al. | 327/379 |
| 6,049,231 | A | 4/2000 | Bosshart | 326/98 |
| 6,052,008 | A | 4/2000 | Chu et al. | 327/200 |
| 6,060,910 | A | 5/2000 | Inui | 326/98 |
| 6,086,619 | A | 7/2000 | Hausman et al. | 703/6 |
| 6,087,855 | A | 7/2000 | Frederick, Jr. et al. | 326/106 |
| 6,090,153 | A | 7/2000 | Chen et al. | 716/8 |
| 6,104,212 | A | 8/2000 | Curran | 326/95 |
| 6,108,805 | A | 8/2000 | Rajsuman | 714/724 |
| 6,132,969 | A | 10/2000 | Stoughton et al. | 435/6 |
| 6,133,759 | A | 10/2000 | Beck et al. | 326/98 |
| 6,204,696 | B1 * | 3/2001 | Krishnamurthy et al. | 326/98 |
| 2001/0014875 | A1 | 8/2001 | Young et al. | 705/37 |

OTHER PUBLICATIONS

Bryant, R.E., "Graph–Based Algorithms for Boolean Function Manipulation", *IEEE Transactions on Computers*, C–35 (8), pp. 677–691, (1986).

Chakradhar, S.T., et al., "An Exact Algorithm for Selecting Partial Scan Flip–Flops", *Proceedings of the 31st Design Automation Conference*, San Diego, California, pp. 81–86, (1994).

Chakravarty, S., "On the Complexity of Using BDDs for the Synthesis and Analysis of Boolean Circuits", *27th Annual Allerton Conference on Communication, Control, and Computing*, Allerton House, Monticello, Illinois, pp. 730–739, (1989).

Patra, P., et al., "Automated Phase Assignment for the Synthesis of Low Power Domino Circuits", *Proceedings of the 36th ACM/IEEE Conference on Design Automation*, pp. 379–384, (1999).

Puri, et al., "Logic Optimization by Output Phase Assignment in Dynamic Logic Synthesis", *International Conference on Computer Aided Design*, 7 p., (1996).

Thompson, S., et al., "Dual Threshold Voltages and Substrate Bias: Keys to High Performance, Low Power, 0.1 $\mu$m Logic Designs", *1997 Symposium on VLSI Technology Digest of Technical Papers*, pp. 69–70, (1997).

* cited by examiner

DOMINO LOGIC WITH LOW-THRESHOLD NMOS PULL-UP

FIELD OF THE INVENTION

The invention relates generally to semiconductor logic devices, and more specifically to domino logic circuitry having a novel NMOS output pull-up.

BACKGROUND OF THE INVENTION

Semiconductor operational frequencies are ever increasing, requiring circuitry and processes that support these faster clock rates. Domino circuits have been used in such circuits to speed processing, due to the way in which a domino logic circuit handles data. A typical domino logic circuit receives data on a first transition of a clock, and couples a logically derived signal to external circuitry on a next transition of the clock.

A conventional domino circuit includes dynamic circuitry coupled to static gate circuitry. The dynamic circuitry precharges an input of the static circuitry when a clock signal is low, and couples an input data signal to the static circuitry when the clock signal is high. The dynamic circuitry often is n-type metal oxide semiconductor (NMOS) pull-down circuitry, that is operable to pull down the level of a relatively weakly held pre-charged circuit node. The node is then latched in static CMOS circuitry to provide a stable output until the next logical cycle.

But, the speed of such logic is limited by the time it takes to pre-charge the dynamic circuit node that provides the data signal to the static CMOS latch and the output, and by the time it takes to pull down the weakly-held precharged node voltage to provide a low signal level to the static CMOS latch circuitry and to change the state of the output One solution to such problems is to reduce the physical size of the circuit elements and reduce the supply and threshold voltages within the circuit, resulting in physically smaller devices able to change state over a smaller voltage range more quickly. But, the reduced threshold voltages and smaller geometry result in high subthreshold and leakage current in the transistors. Also, the low threshold voltages coupled with faster signal edges and greater noise coupling due to smaller geometry contribute to increasingly substantial noise problems. A higher threshold voltage may be used to compensate for higher noise, but a circuit providing a lower threshold voltage with faster operation is desirable.

For these reasons and others that will be apparent to those skilled in the art upon reading and understanding this specification, a need exists for a domino logic circuit that retains a low threshold voltage while providing an adequate noise margin.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

Because domino logic circuits are typically employed in logic circuits where the highest possible speed is desired, a need exists for domino logic circuits that provide for the fastest operational speeds as can be practically achieved. Such desired increases in speed can be realized by modifying a domino logic circuit to change states more quickly, such as by altering threshold points or otherwise decreasing the voltage swing needed to change states. The present invention provides a domino logic circuit that reduces the time required to change the state of the output signal of a domino logic circuit to provide a faster overall signal propagation speed, and that retains a low threshold voltage while providing an adequate noise margin. The present invention therefore enables faster overall domino logic circuit operation than traditional domino logic using the same fabrication process, and therefore offers a desirable improvement over the prior art.

Figure 1:
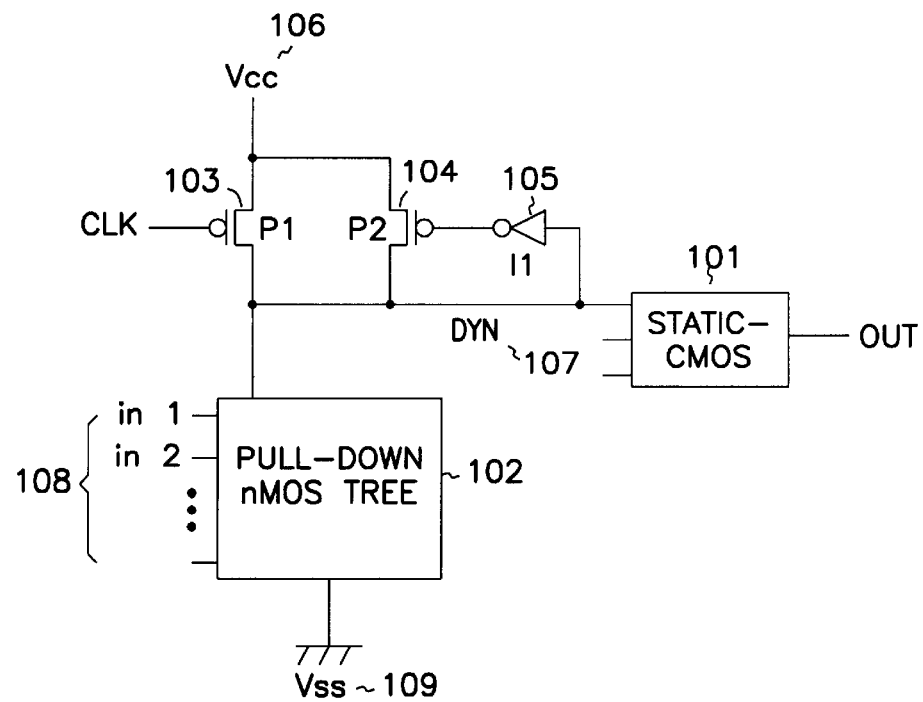
FIG. 1 shows a domino logic circuit, consistent with the prior art.

FIG. 1 illustrates a typical prior art domino logic circuit. The circuit consists essentially of three stages, including a static complementary metal-oxide semiconductor (CMOS) circuit 101, a dynamic precharge circuit, and a pull-down n-channel metal oxide semiconductor (NMOS) circuit 102. The dynamic precharge circuit typically consists of a p-channel transistor 103 that is coupled to a clock signal at its gate, and a second p-channel transistor 104 that is coupled to an inverter 105 output at its gate. Both p-channel transistors 103 and 104 are connected between a first voltage connection 106 and a dynamic output node 107, and the input of the inverter 105 is further connected to the dynamic output node 107. The dynamic output node is connected to the static CMOS circuit 101, and to the pull-down NMOS tree 102. The pull down NMOS tree 102 is further connected to one or more inputs 1 through n shown at 108, and to a second voltage connection 109. In some embodiments, p-channel transistor 104 has a relatively small channel width or other feature to reduce the current conducted by the transistor.

In operation, the p-channel transistor 103 conducts when the clock signal is low, charging dynamic output node 107 to approximately the voltage level of the first voltage connection 106. This stage is known as the precharge phase or reset phase, because the dynamic output node is charged to the voltage present at 106. When the clock signal goes high, the p-channel transistor 103 no longer conducts, and the voltage level at the dynamic output node 107 is maintained high by p-channel transistor 104.

Transistor 104 and inverter 105 form a level keeper portion of the circuit, and function to weakly maintain the present high state of the dynamic output node 107 when the clock signal is high. Because the dynamic output node is at high voltage when the clock transitions from low to high, the dynamic output node high voltage signal is inverted by the inverter and turns the p-channel transistor 104 on, maintaining a connection between the first voltage connection 106 and the dynamic output node 107. P-channel transistor 104 is intentionally designed to be somewhat weak, or to have a low current when on, so that the dynamic output node can be driven toward the second voltage level despite the level keeper.

The pull-down NMOS tree 102 implements the logic portion of the circuit, and is connected between the dynamic output node and the second voltage connection 109. The pull-down NMOS tree either connects or does not connect the dynamic output node to ground, depending on the desired logical output. Therefore, the pull-down tree may be designed to implement any desired function, and determines the function of the whole domino logic circuit. If the pull-down NMOS tree is turned on and conducts between the second voltage connection 109 and the dynamic output node 107, the conduction to a low voltage level overcomes the high voltage connection via p-channel transistor 104 of the level keeper, forcing the dynamic output node to a low voltage state. The level keeper circuit then turns transistor 104 off, leaving the dynamic output node at a low voltage level.

After sufficient time has passed for the dynamic output node to change states from the first voltage level to the second voltage level if necessary, the dynamic output node signal provides a logical output signal representing the logic of the pull-down NMOS tree, and is input to a static CMOS circuit 101. The static CMOS circuit then provides a high or low voltage output, based on the voltage level of the dynamic output node 107 and any other inputs to the static CMOS circuit. The transition speed of the static CMOS circuit partially depends on its threshold point. Adjustment or skew of the threshold point of the static CMOS circuit to a higher voltage level may be employed to reduce the time needed for the dynamic output node to cross the threshold point, substantially increasing the speed of the domino logic stage.

The time needed for the static CMOS circuit to change state after the clock signal transitions high is dependent on the time needed to pull the dynamic output node 107 down from its first voltage level to a voltage level below the threshold point Vt of the static CMOS circuit. In this circuit, the voltage swing must therefore be Vcc–Vt, or the high voltage connection voltage level minus the threshold voltage of the static CMOS circuit. The voltage threshold Vt is typically about Vcc/2, meaning a voltage swing of one-half Vcc at the input is necessary to change states. The threshold point Vt may be set higher than Vcc/2, to skew the threshold point. This permits the voltage of the dynamic output node 107 to change state from Vcc to Vcc–Vt more rapidly, and so provides faster operation. Such a modified circuit results in faster switching of the state of the dynamic output node, and faster CMOS static gate 101 reaction to the change in the dynamic output node state.

Figure 2:
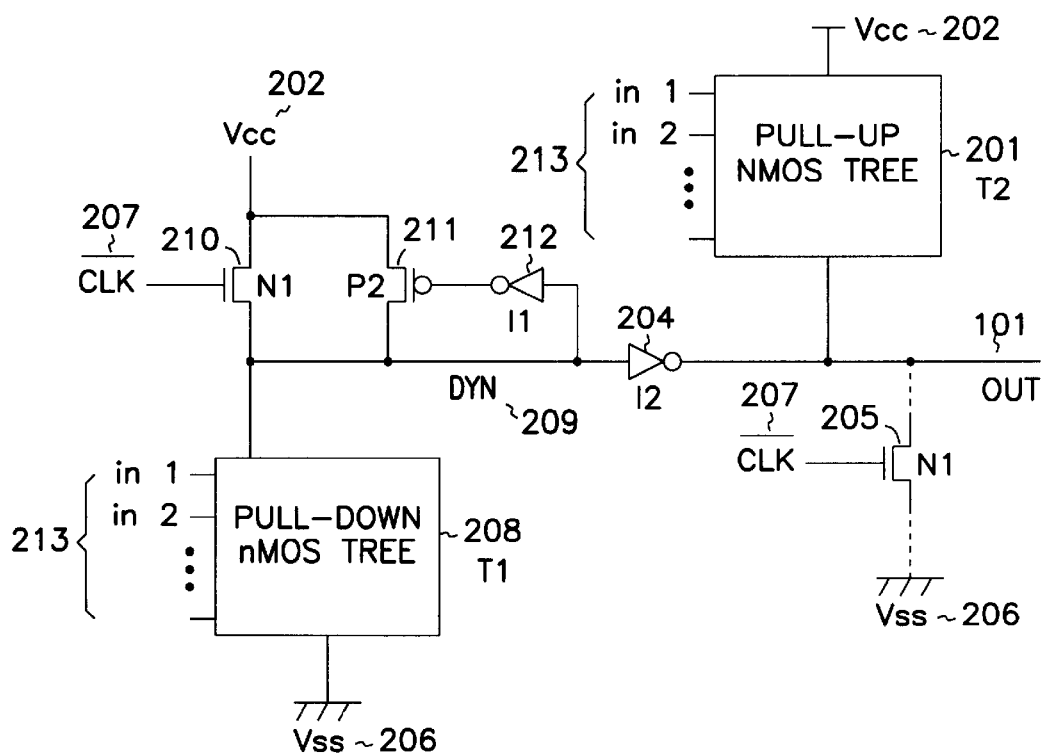
FIG. 2 shows a domino logic circuit incorporating a novel pull-up NMOS tree, consistent with the present invention.

FIG. 2 illustrates a domino logic circuit incorporating an example embodiment of the invention having a novel low-threshold NMOS pull-up circuit 201. The pull-up circuit is connected between the first voltage source 202 and the output node 203, after static output gate 204 which is shown here as a simple inverter. One or more inputs 213 to the pull-up NMOS tree 201 are connected to the same input signals as is the pull-down NMOS tree 208. Optionally, an NMOS pull-down transistor is also coupled between the output node 203 and the second voltage source 206 with the gate coupled to an inverse clock signal 207, serving as an output predischarge transistor.

In operation the novel pull-up NMOS tree receives via the input connections 213 the same logical signals as are provided to the pull-down NMOS tree 208, both of which implement the logic function of the domino logic gate. When the clock is low, the circuit is again in precharge phase, the dynamic output node 209 brought to a first voltage source level 202 by transistor 210. In alternative embodiments of the invention, transistor 210 may be a p-channel transistor that receives a noninverted clock signal. Similarly transistor 211 that forms part of the level keeper circuit may be implemented with an n-channel transistor, but inverter 212 must be supplemented with a second inverter in series with the n-channel transistor and the inverter 212.

In embodiments of the invention with output predischarge transistor 205, the low clock similarly triggers transistor 205 to conduct, bringing the output node 213 near the second voltage level 206. In such cases it is important that transistor 210 and 205 are switched on and off simultaneously, avoiding a short-circuit condition within the gate. This is a particularly important design considerations where transistors 210 and 205 are not of the same channel type, and so receive different clock signals.

When the clock signal goes high, transistor 210 and 205 no longer conduct, and the circuit enters the evaluation phase. If the logic output is positive or one, the pull-down nmos tree 208 conducts and pulls the dynamic output node 209 down near the second voltage level 206, which is typically ground. Similarly, the pull-up nmos tree 201 conducts, bringing the output node 213 near the first voltage level 202. As the dynamic output node changes state low and overcomes the level-keeper circuit's initial precharge state, the inverter 204 changes state and also contributes to a high output near the first voltage level Vcc 202 at the output node. Because the pull-up nmos tree only helps pull the output node up at the beginning of the transition which is later controlled by a static output stage such as inverter 204, the pull-up tree can be made of relatively weak low-threshold devices to provide noise and glitch resistance.

Such a gate configuration not only has been found to increase performance in certain applications such as wide-OR and AB+C gates over the traditional circuit shown in FIG. 1, but also improves the noise margin in many cases. Low threshold devices are often not used in traditional high fan-in domino logic trees due to the excessively high sub-threshold current conducted through numerous transistors in a tree to cause a domino logic gate state change. In the inventive domino logic circuit, the nmos pull-up tree 201 automatically cuts down its sub-threshold current rapidly when the voltage at the output node goes up, which consequently reduces the voltage level (and therefore noise) to be pulled up by the sub-threshold current conducted through the pull-up tree. This self-debiasing effect is due to the source follower characteristic of the nmos pull-up tree, which allows usage of very low threshold devices within the tree. Use of low threshold devices again further improves the gate operation speed and therefore the performance of the domino logic gate.

It is anticipated that a variety of static CMOS circuit embodiments may be used in various applications, all of which may benefit from use of the output predischarge transistor of the present invention. The output predischarge transistor in various embodiments may be controlled by the clock or by the dynamic output node, or by any other node providing an appropriate signal indicating that the circuit is in a reset or precharge phase. In some further embodiments, the output predischarge transistor is controlled by the clock which changes state faster than the dynamic output node, thereby providing even faster operation. Still other elements of the domino logic circuit may be altered, but the circuit will remain within the scope of the present invention by including the novel pull-up nmos tree.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

We claim:

1. A circuit, comprising:
    a clock transistor coupled between a dynamic output node and a first supply voltage, a gate of the clock transistor coupled to receive a clock signal;
    an inverter, an input of the inverter connected to the dynamic output node;
    a level keeper transistor coupled between the dynamic output node and the first supply voltage, a gate of the level keeper transistor coupled to an output of the inverter;
    a pull-down circuit connected between the dynamic output node and a second supply voltage;
    a static CMOS circuit, an input of the static CMOS circuit connected to the dynamic output node;
    a pull-up circuit connected between an output of the static CMOS circuit and the first supply voltage; and
    an output predischarge transistor coupled between the output of the static CMOS circuit and the second supply voltage, a gate of the output predischarge transistor connected to receive a clock signal.

2. The circuit of claim 1, wherein the clock transistor is an n-channel transistor and the clock signal coupled to the gate of the clock transistor is an inverted clock signal.

3. The circuit of claim 1, wherein the pull-down circuit is a pull-down NMOS tree.

4. The circuit of claim 1, wherein the pull-up circuit is a pull-up NMOS tree.

5. The circuit of claim 1, wherein the level keeper is a p-channel transistor.

6. The circuit of claim 1, wherein the static CMOS circuit comprises a second inverter.

7. (Amended) An integrated circuit, comprising:
    a first input connection for receiving a clock signal;
    a second input connection for receiving an input data signal;
    a domino logic circuit coupled to receive the clock signal and the input data signal, the domino logic circuit comprising a pull-up circuit connected between an output of the domino logic circuit and a first supply voltage; and
    an output predischarge transistor coupled between the output of the domino logic circuit and the second supply voltage, a gate of the output predischarge transistor connected to receive a clock signal.

8. The integrated circuit of claim 7, wherein the output of the domino logic circuit comprises
    an output of a static CMOS gate comprising a part of the domino logic circuit.

9. The integrated circuit of claim 8, wherein the static CMOS gate comprises an inverter.

10. The integrated circuit of claim 7, wherein the domino logic circuit further comprises an n-channel transistor coupled between a second voltage supply and the output of the domino logic circuit, a gate of the n-channel transistor coupled to receive an inverse clock signal.

11. The integrated circuit of claim 7, wherein the domino logic circuit further comprises a pull-down circuit coupled between a dynamic output node and a second voltage supply, such that the pull-down circuit is coupled to receive the input data signal.

12. The integrated circuit of claim 11, wherein the pull-down circuit is a pull-down NMOS tree.

13. A processor integrated circuit, comprising a domino logic circuit coupled to receive an input clock signal and a data signal, the domino logic circuit comprising:
    a pull-up circuit connected between an output of the domino logic circuit and a first supply voltage;
    a pull-down circuit connected between a dynamic output node and a second supply voltage; and
    an output predischarge transistor coupled between the output of the domino logic circuit and the second supply voltage, a gate of the output predischarge transistor connected to receive a clock signal.

14. The processor integrated circuit of claim 13, wherein the output of the domino logic circuit comprises the output of a static CMOS gate comprising a part of the domino logic circuit.

15. The processor integrated circuit of claim 14, wherein the static CMOS gate comprises an inverter.

16. A method of operating a domino logic circuit, comprising:
    receiving a clock signal via a first transistor coupled between a first supply voltage and a dynamic output node;
    charging the dynamic output node of the domino logic circuit via the first transistor when the clock signal causes the first transistor to turn on;
    receiving an input data signal via a pull-down circuit connected between the dynamic output node and a second supply voltage;
    receiving the input data signal via a pull-up circuit connected between an output of a static CMOS circuit and the first supply voltage;
    evaluating the input data signal by selectively coupling both the dynamic output node to the second supply voltage and by coupling the output of the static CMOS circuit to the first supply voltage, both selective couplings in response to the input data signal; and
    receiving the clock signal via an output predischarge transistor coupled between the output of the static CMOS circuit and the second supply voltage; and
    pulling the voltage present at the output of the static CMOS circuit to approximately the voltage level of the second supply voltage when the clock signal causes the output predischarge transistor to turn on.

17. The method of claim 16, wherein the pull-up circuit is an NMOS tree.

18. A circuit, comprising:
    an n-channel clock transistor coupled between a dynamic output node and a first supply voltage, a gate of the n-channel clock transistor coupled to receive a clock signal;
    an inverter, an input of the inverter connected to the dynamic output node;
    a p-channel level keeper transistor coupled between the dynamic output node and the first supply voltage, a gate of the p-channel level keeper transistor coupled to the output of the inverter;
    an NMOS tree pull-down circuit connected between the dynamic output node and a second supply voltage;
    a static CMOS circuit, an input of the static CMOS circuit connected to the dynamic output node;

an NMOS tree pull-up circuit connected between an output of the static CMOS circuit and the first supply voltage; and an n-channel output predischarge transistor coupled between the output of the static CMOS circuit and the second supply voltage, a gate of the n-channel predischarge transistor connected to receive a clock signal.

19. The circuit of claim 15, wherein the static CMOS circuit is an inverter.

20. The circuit of claim 18, wherein the NMOS pull-up tree and the NMOS pull-down tree are connected via inputs of each tree to the same input signals.

* * * * *

UNITED STATES PATENT AND TRADEMARK OFFICE
CERTIFICATE OF CORRECTION

PATENT NO. : 6,486,706 B2
DATED : November 26, 2002
INVENTOR(S) : Yibin Ye, Siva G. Narendra and Vivek K. De It is certified that error appears in the above-identified patent and that said Letters Patent is hereby corrected as shown below:

Column 1,
Line 36, insert -- . -- after "output".

Column 5,
Line 34, insert -- transistor -- after "keeper".

Column 8,
Line 1, delete "claim 15" and insert -- claim 18 --, therefor.

Signed and Sealed this

Twenty-second Day of April, 2003

JAMES E. ROGAN
*Director of the United States Patent and Trademark Office*